(12) United States Patent
Choi et al.

(10) Patent No.: US 11,365,123 B2
(45) Date of Patent: Jun. 21, 2022

(54) METHOD FOR PRODUCING GRAPHENE NANOSPHERES

(71) Applicant: KOREA UNIVERSITY OF TECHNOLOGY AND EDUCATION INDUSTRY-UNIVERSITY COOPERATION FOUNDATION, Cheonan-si (KR)

(72) Inventors: Soon Mok Choi, Cheonan-si (KR); Byeong-Geun Kim, Seongnam-si (KR)

(73) Assignee: KOREA UNIVERSITY OF TECHNOLOGY AND EDUCATION INDUSTRY-UNIVERSITY COOPERATION FOUNDATION, Cheonan-si (KR)

( * ) Notice: Subject to any disclaimer, the term of this patent is extended or adjusted under 35 U.S.C. 154(b) by 205 days.

(21) Appl. No.: 16/639,805

(22) PCT Filed: Aug. 16, 2018

(86) PCT No.: PCT/KR2018/009402
§ 371 (c)(1),
(2) Date: Feb. 18, 2020

(87) PCT Pub. No.: WO2019/035663
PCT Pub. Date: Feb. 21, 2019

(65) Prior Publication Data
US 2020/0247677 A1    Aug. 6, 2020

(30) Foreign Application Priority Data

Aug. 18, 2017    (KR) .......................... 10-2017-0104852

(51) Int. Cl.
*C01B 32/186*    (2017.01)
*C23C 16/26*    (2006.01)

(52) U.S. Cl.
CPC ............ *C01B 32/186* (2017.08); *C23C 16/26* (2013.01); *C01P 2002/72* (2013.01);
(Continued)

(58) Field of Classification Search
CPC ... C01B 32/186; C23C 16/26; C01P 2004/34; C01P 2004/64
See application file for complete search history.

(56) References Cited

U.S. PATENT DOCUMENTS

2017/0133690 A1    5/2017    Ha et al.

FOREIGN PATENT DOCUMENTS

CN            106219523 A       12/2016
KR     10-2004-0101858 A        12/2004
(Continued)

OTHER PUBLICATIONS

Jeanne N'diaye et al., "One-Step In-Situ Growth of Core-Shell SiC@Graphene Nanoparticles/Graphene Hybrids by Chemical Vapor Deposition", Advanced Materials Interfaces, 2016, 6 pages, vol. 3, No. 81500806. (Year: 2016).*

(Continued)

*Primary Examiner* — Michael P Wieczorek
(74) *Attorney, Agent, or Firm* — Sughrue Mion, PLLC

(57) ABSTRACT

The present invention provides a method of manufacturing a graphene nanosphere through a single process that is simplified in order to enable mass production. The method includes step 1 of manufacturing a silicon carbide nanosphere coated with graphene through chemical vapor deposition (CVD) using a gas containing a silicon source and a carbon source and step 2 of discontinuing the chemical vapor deposition (CVD) and then performing cooling.

9 Claims, 5 Drawing Sheets

(52) U.S. Cl.
CPC ...... *C01P 2002/82* (2013.01); *C01P 2002/85* (2013.01); *C01P 2004/03* (2013.01); *C01P 2004/04* (2013.01); *C01P 2004/34* (2013.01); *C01P 2004/64* (2013.01)

(56) References Cited

FOREIGN PATENT DOCUMENTS

| KR | 10-0596291 B1 | 7/2006 |
| KR | 10-1452397 B1 | 10/2014 |
| KR | 10-1486760 B1 | 1/2015 |
| WO | 2015/010230 A1 | 1/2015 |

OTHER PUBLICATIONS

Kim et al; "One-step growth of multilayer-graphene hollow nanospheres via the self-elimination of SiC nuclei templates", Scientific Reports, Oct. 23, 20217, vol. 7, 13774. (Year: 2017).*
Jeanne N'diaye et al., "One-Step In-Situ Growth of Core-Shell SiC@Graphene Nanoparticles/Graphene Hybrids by Chemical Vapor Deposition", Advanced Materials Interfaces, 2016, 6 pages, vol. 3, No. 8 1500806.
Hao Zhuang et al., "Graphene/3C-SiC Hybrid Nanolaminate", ACS Applied Materials & Interfaces, 2015, 42 pages, vol. 7, No. 51.
Tao Chen et al., "Macroscopic Graphene Fibers Directly Assembled from CVD-Grown Fiber-Shaped Hollow Graphene Tubes", Angewandte Chemie, 2015, pp. 15160-15163, vol. 127.
Byeong Geun Kim et al., "One-step Growth of Multilayer-graphene Hollow Nanospheres via the Self-elimination of SiC Nuclei Templates", Scientific Reports, Oct. 23, 2017, 8 pages, vol. 7, 13774.
International Search Report for PCT/KR2018/009402 dated Dec. 18, 2018 [PCT/ISA/210].

\* cited by examiner

METHOD FOR PRODUCING GRAPHENE NANOSPHERES

CROSS REFERENCE TO RELATED APPLICATIONS

This application is a National Stage of International Application No. PCT/KR2018/009402 filed Aug. 16, 2018, claiming priority based on Korean Patent Application No. 10-2017-0104852 filed Aug. 18, 2017, the entire disclosures of which are incorporated herein by reference.

TECHNICAL FIELD

The present invention relates to a method of manufacturing a graphene nanosphere, and more particularly to a method of manufacturing a graphene nanosphere using a single chemical vapor deposition (CVD) process.

BACKGROUND ART

In the future, graphene is expected to be utilized in a very wide range of industries, including those of semiconductor materials and devices, energy storage and conversion systems, transparent electrodes, functional composite materials, heat-dissipating materials, barrier coatings, printed electronics, and the like, due to the superior physical and chemical properties thereof.

Nanostructures such as nanowires or nanotubes are very useful in a variety of fields because of the small nano-scale sizes, high surface areas, shapes and the like thereof. In the case of graphene, research into application thereof in various fields such as those of electronics, biotechnology, etc. is being actively conducted these days by artificially changing the structure, shape or the like of graphene.

In accordance with the rapid development of IT technology, a drastic increase in the demand of advanced electronic devices such as smartphones is required in order to develop high-density high-power next-generation energy storage systems, and thus thorough research related to secondary batteries and capacitors is currently ongoing.

In order to develop a battery of high density/high power, it is necessary to develop an electrode material having a high specific capacitance and an electrolyte having a wide potential window. Hollow graphene nanospheres, in particular, have a large surface area, high electrical conductivity, and superior physical and chemical properties, and are receiving a great deal of attention as an ideal alternative to supercapacitor electrode materials.

Methods of manufacturing hollow graphene nanospheres that have been developed to date include joule heating, laser processing, high-temperature carbonization and solution methods, and mostly use templates such as metal particles. For example, Korean Patent No. 10-1452397 discloses a method of manufacturing hollow graphene particles having high air permeability using a capillary molding phenomenon during pyrolysis of polymer particles through the addition of a colloidal solution.

The method using the template has the advantage of producing reproducible graphene nanospheres, but is disadvantageous in that the metal particles used as the template must be removed in a subsequent process.

Therefore, with the goal of realizing technical commercialization, it is necessary to simplify processing in order to enable mass production and efficient production.

CITATION LIST

Patent Literature

1. Korean Patent No. 10-1452397

DISCLOSURE

Technical Problem

An objective of the present invention is to provide a method of manufacturing a graphene nanosphere through a single process that is simplified in order to enable mass production.

Technical Solution

In order to accomplish the above objective, the present invention provides a method of manufacturing a graphene nanosphere including step 1 of manufacturing a silicon carbide nanosphere coated with graphene through chemical vapor deposition (CVD) using a gas containing a silicon source and a carbon source, and step 2 of discontinuing the chemical vapor deposition (CVD) and then performing cooling.

In the method of manufacturing the graphene nanosphere according to an embodiment of the present invention, the silicon source and the carbon source may be a single gas containing silicon and carbon.

In the method of manufacturing the graphene nanosphere according to an embodiment of the present invention, step 1 may be performed at a temperature of 1000 to 3000° C. under a pressure of 100 to 760 torr.

In the method of manufacturing the graphene nanosphere according to an embodiment of the present invention, step 1 may be performed at a temperature of 1000 to less than 2000° C.

In the method of manufacturing the graphene nanosphere according to an embodiment of the present invention, the graphene nanosphere may include a silicon carbide nanocrystal core and a graphene coating layer formed on the core.

In the method of manufacturing the graphene nanosphere according to an embodiment of the present invention, step 1 may be performed at a temperature of 2000 to 3000° C.

In the method of manufacturing the graphene nanosphere according to an embodiment of the present invention, the graphene nanosphere may be a hollow graphene nanosphere.

In the method of manufacturing the graphene nanosphere according to an embodiment of the present invention, step 1 may include supplying a gas containing a carrier gas.

In the method of manufacturing the graphene nanosphere according to an embodiment of the present invention, a flow rate ratio of (carrier gas)/(silicon source and carbon source) in step 1 may be 10 to 1000.

In addition, the present invention provides a graphene nanosphere manufactured through a single chemical vapor deposition (CVD) process.

Advantageous Effects

According to the present invention, a graphene nanosphere can be manufactured through a single process that is simplified in order to enable mass production. Moreover, processing conditions are controlled, thus enabling the manufacture of a hollow graphene nanosphere and a graphene nanosphere having a silicon carbide nanocrystal core therein. The graphene nanosphere thus manufactured can be widely used in the development of supercapacitors, lithium batteries, structural reinforcement materials, catalyst supports, etc. because of the superior mechanical and electrical properties of graphene.

MODE FOR INVENTION

Hereinafter, a detailed description will be given of the present invention.

The present invention pertains to a method of manufacturing a graphene nanosphere through a process that is simplified in order to enable mass production. According to the present invention, a graphene nanosphere may be manufactured using a single chemical vapor deposition (CVD) process, and by controlling the processing conditions, a hollow graphene nanosphere and a graphene nanosphere having a silicon carbide nanocrystal core therein may be selectively manufactured.

The method of manufacturing the graphene nanosphere according to the present invention includes step 1 of manufacturing a silicon carbide nanosphere coated with graphene through chemical vapor deposition (CVD) using a gas containing a silicon source and a carbon source and step 2 of discontinuing the chemical vapor deposition (CVD) and then performing cooling.

Figure 1:
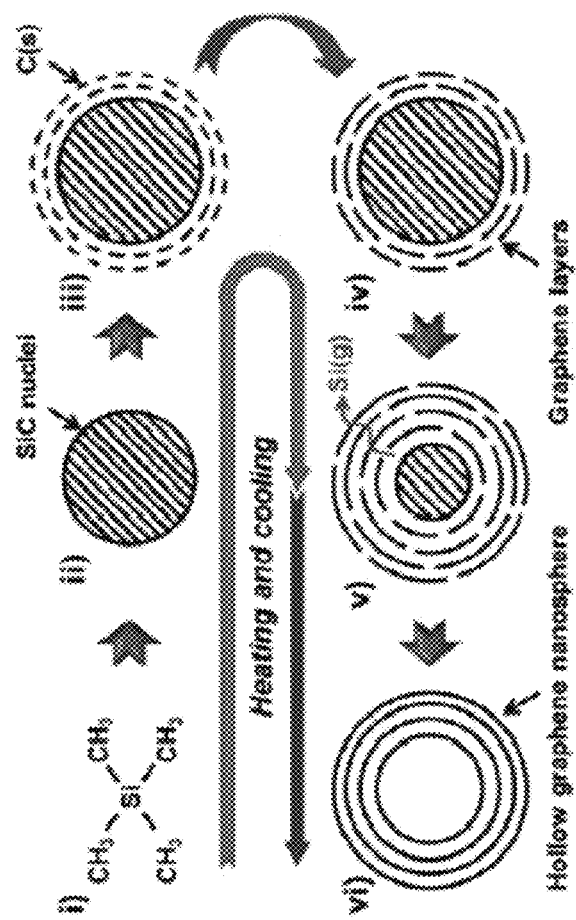
FIG. 1 schematically shows a process of manufacturing a graphene nanosphere using chemical vapor deposition according to the present invention.

FIG. 1 schematically shows the process of manufacturing the graphene nanosphere according to the present invention. With reference to FIG. 1, individual steps are described below.

Specifically, a silicon carbide nanosphere coated with graphene is manufactured through chemical vapor deposition (CVD) using a gas containing a silicon source and a carbon source (step 1).

With reference to FIG. 1, the silicon source and the carbon source, which are precursors, are placed together with a carrier gas such as hydrogen in a chemical vapor deposition reactor (in FIG. 1, step i)), after which the precursors are pyrolyzed using heat energy at a high temperature, thus forming a silicon carbide (SiC) nanocrystal having a size of less than 15 nm (in FIG. 1, step ii)).

Thereafter, a carbon (C) solid phase is formed on the surface of the silicon carbide (SiC) nanocrystal (in FIG. 1, step iii)), and the carbon (C) solid phase is rearranged to thus form graphene having a layered structure (in FIG. 1, step iv)), and this layered structure prevents the internal supply of the source for growing the silicon carbide (SiC) nanocrystal. Accordingly, after step iv) of FIG. 1, the silicon carbide (SiC) nanocrystal may not grow.

Here, the silicon source and the carbon source may be used in the form of a single gas containing silicon (Si) and carbon (C), and examples thereof may include, but are not limited to, trichlorosilane, tetramethylsilane, methyltrichlorosilane and the like.

Also, the silicon source and the carbon source may be used separately, and the silicon source may include silicon-containing gas, such as silane ($SiH_4$) gas or disilane ($Si_2H_6$) gas.

The carbon source may be any one selected from the group consisting of carbon monoxide, carbon dioxide, methane, ethane, ethylene, ethanol, acetylene, propane, propylene, butane, butylene, butadiene, pentane, pentene, pentyne, pentadiene, cyclopentane, cyclopentadiene, hexane, hexene, cyclohexane, cyclohexadiene, benzene, toluene and combinations thereof.

The carrier gas, which is used together with the silicon source and the carbon source, may be selected from the group consisting of hydrogen ($H_2$), argon (Ar), nitrogen ($N_2$) and combinations thereof.

In the method of manufacturing the graphene nanosphere according to an embodiment of the present invention, the carrier gas and the silicon source and carbon source may be supplied at a flow rate ratio ((flow rate (cc/min) of carrier gas)/(flow rate (cc/min) of silicon source and carbon source)) of 10-2000. For example, $H_2$ and tetramethylsilane may be supplied at a constant flow rate ratio of 100-500.

The chemical vapor deposition may be carried out under constant conditions of a temperature of 1000 to 3000° C. and a reactor chamber pressure of 100 to 760 torr.

In the present invention, the inner temperature of the reactor has to be set within an appropriate temperature range in order to form a silicon carbide nanocrystal seed for the graphene nanosphere and to pyrolyze the silicon carbide nanocrystal covered with a carbon solid phase into a silicon gas phase and a carbon solid phase.

For example, when the temperature is set in the range of 1000 to less than 2000° C., the silicon carbide nanocrystal covered with a carbon solid phase is not sufficiently pyrolyzed into a silicon gas phase and a carbon solid phase, thus obtaining a graphene nanosphere having a silicon carbide nanocrystal core and a graphene coating layer formed on the core.

In another example, when the temperature is set in the range of 2000 to 3000° C., the carbide nanocrystal covered with a carbon solid phase is sufficiently pyrolyzed into a silicon gas phase and a carbon solid phase, thus obtaining a graphene nanosphere, the inside of which is empty, that is, a hollow graphene nanosphere.

Next, the chemical vapor deposition is discontinued and then cooling is performed (step 2).

Here, the cooling process is preferably performed through furnace cooling in order to manufacture a nanosphere or a hollow nanosphere having high graphene crystallinity by appropriately pyrolyzing the silicon carbide (SiC) nanocrystal using heat energy applied during chemical vapor deposition.

With reference to FIG. 1, the silicon carbide (SiC) nanocrystal covered with the carbon (C) solid phase is removed while being pyrolyzed into a silicon (Si) gas phase and a carbon (C) solid phase using high-temperature heat energy without source supply. During furnace cooling to a low temperature from a high temperature after discontinuing the source supply, additional pyrolysis of SiC nanocrystals occurs. The furnace cooling may be conducted at a cooling rate of 5 to 15° C./min. Among pyrolyzed elements, silicon (Si) has high vapor pressure compared to carbon (C), and the melting point thereof is relatively low, and thus silicon (Si) in a gas phase is released from between the layers of the carbon (C) solid phase (in FIG. 1, step v)).

Thereafter, the silicon carbide (SiC) nanocrystal is completely decomposed, and rearrangement of the carbon (C) solid phase continues to thus complete the layered structure, thereby forming a graphene nanosphere, the inside of which is empty, namely a hollow graphene sphere (in FIG. 1, step vi)).

According to the present invention, it is possible to efficiently and economically manufacture a graphene nanosphere through a single process, unlike a conventional method of manufacturing a graphene nanosphere.

The graphene nanosphere, composed of the core including the silicon carbide (SiC) nanocrystal and the graphene layer formed on the core, may exhibit superior mechanical properties and may thus be utilized as a structural reinforcement material, and the hollow graphene sphere may be applied to supercapacitors, lithium batteries, catalyst supports, etc.

A better understanding of the present invention will be given through preferred examples and test examples. The following examples and test examples are merely set forth to more clearly express the present invention, but are not to be construed as limiting the scope of the present invention.

EXAMPLE 1

Hydrogen gas and tetramethylsilane (TMS) were placed at a flow rate ratio of $H_2$/TMS of 320 in a reactor, heated under a pressure of 550 torr, reacted for 1 hr at a maximum temperature of 2100° C., and then cooled to room temperature.

Figure 2:
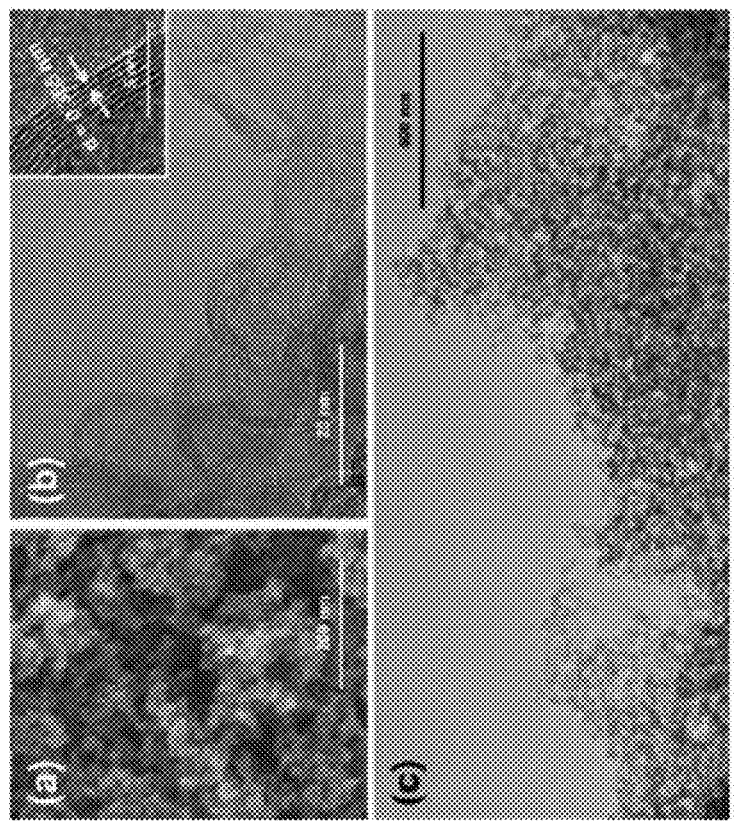
FIG. 2 shows (a) a scanning electron microscope (SEM) image and (b) and (c) transmission electron microscope (TEM) images of the hollow graphene nanospheres manufactured in Example 1 of the present invention.

FIG. 2 shows (a) a scanning electron microscope (SEM) image and (b) and (c) transmission electron microscope (TEM) images of the hollow graphene nanospheres manufactured in Example 1 of the present invention. With reference to FIG. 2, it can be seen that the hollow graphene nanospheres had a spherical shape ((a)) and that the spherical graphene nanospheres were hollow ((b), (c)). As is apparent from the high-resolution transmission electron microscope (HRTEM) image in (b) of FIG. 2, graphene had a layered structure. With reference to FIG. 2, it can be confirmed that the hollow graphene nanospheres had an inner diameter of 20 to 30 nm.

Figure 3:
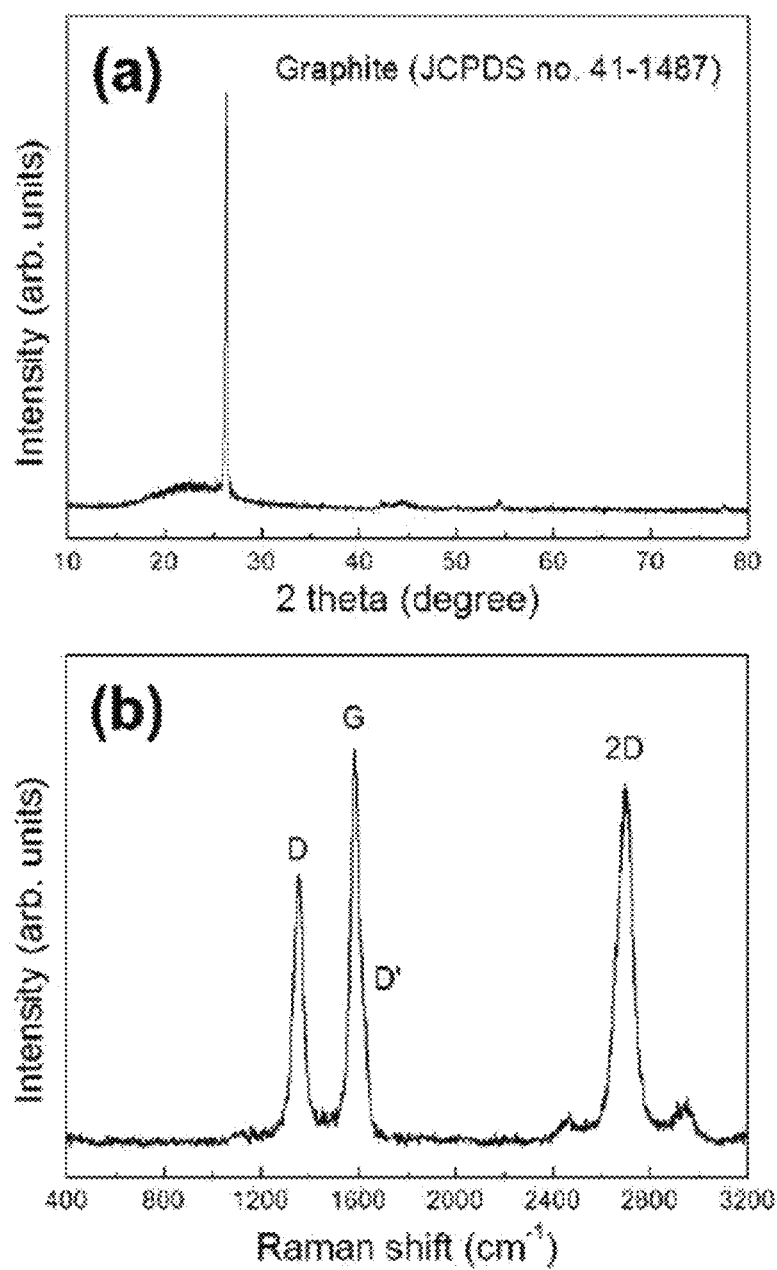
FIG. 3 shows (a) an XRD graph and (b) a Raman spectrum of the hollow graphene nanospheres manufactured in Example 1 of the present invention.

FIG. 3 shows (a) an XRD graph and (b) a Raman spectrum of the hollow graphene nanospheres manufactured in Example 1 of the present invention. As shown in FIG. 3, the hollow graphene spheres of Example 1 can be confirmed to be graphitic carbon having few defects and good crystallinity. Moreover, despite the use of both the silicon source and the carbon source, it can be confirmed that the phase related to silicon (Si) or silicon carbide (SiC) was absent.

In Example 1, 100% of the reaction product was hollow graphene nanospheres.

EXAMPLE 2

The present example was performed in the same manner as in Example 1, with the exception that the maximum temperature was set to 1500° C.

Figure 4:
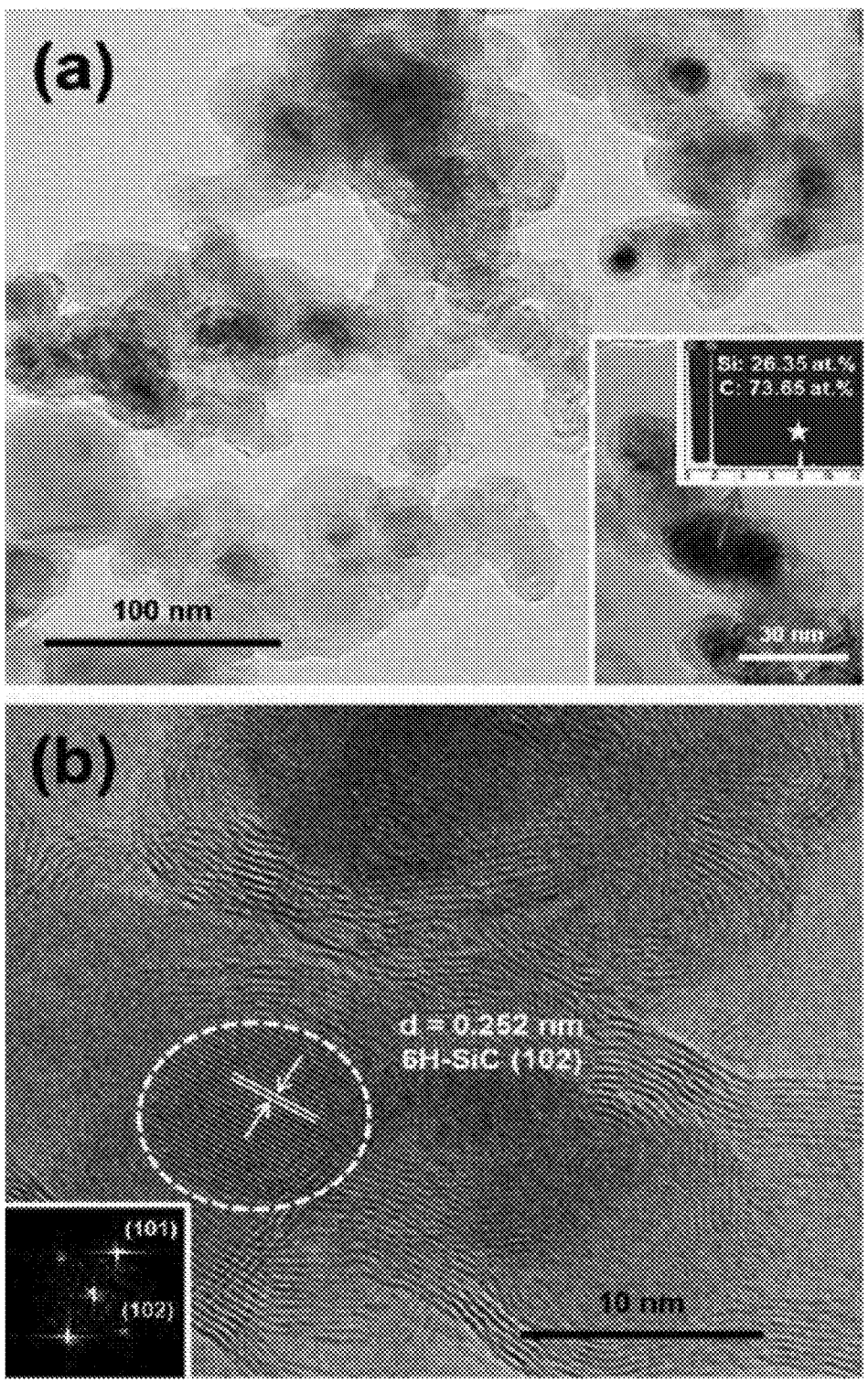
FIG. 4 shows (a) a TEM image and the results of energy-dispersive spectroscopy (EDS) and (b) a Raman spectrum of the graphene nanospheres manufactured in Example 2 of the present invention.

FIG. 4 shows (a) a TEM image and the results of energy-dispersive spectroscopy (EDS) and (b) a Raman spectrum of the graphene nanospheres manufactured in Example 2 of the present invention. With reference to FIG. 4, in the graphene nanospheres produced at a low temperature of 1500° C., particles in which the insides of the graphene nanospheres were filled with silicon carbide (SiC) nanocrystal were observed, unlike the hollow graphene nanospheres of Example 1 manufactured at 2100° C.

In Example 2, 60% of the reaction product was hollow graphene nanospheres, and the remaining 40% was graphene nanospheres, the insides of which were filled.

EXAMPLE 3

The present example was performed in the same manner as in Example 1, with the exception that the maximum temperature was set to 1900° C.

Figure 5:
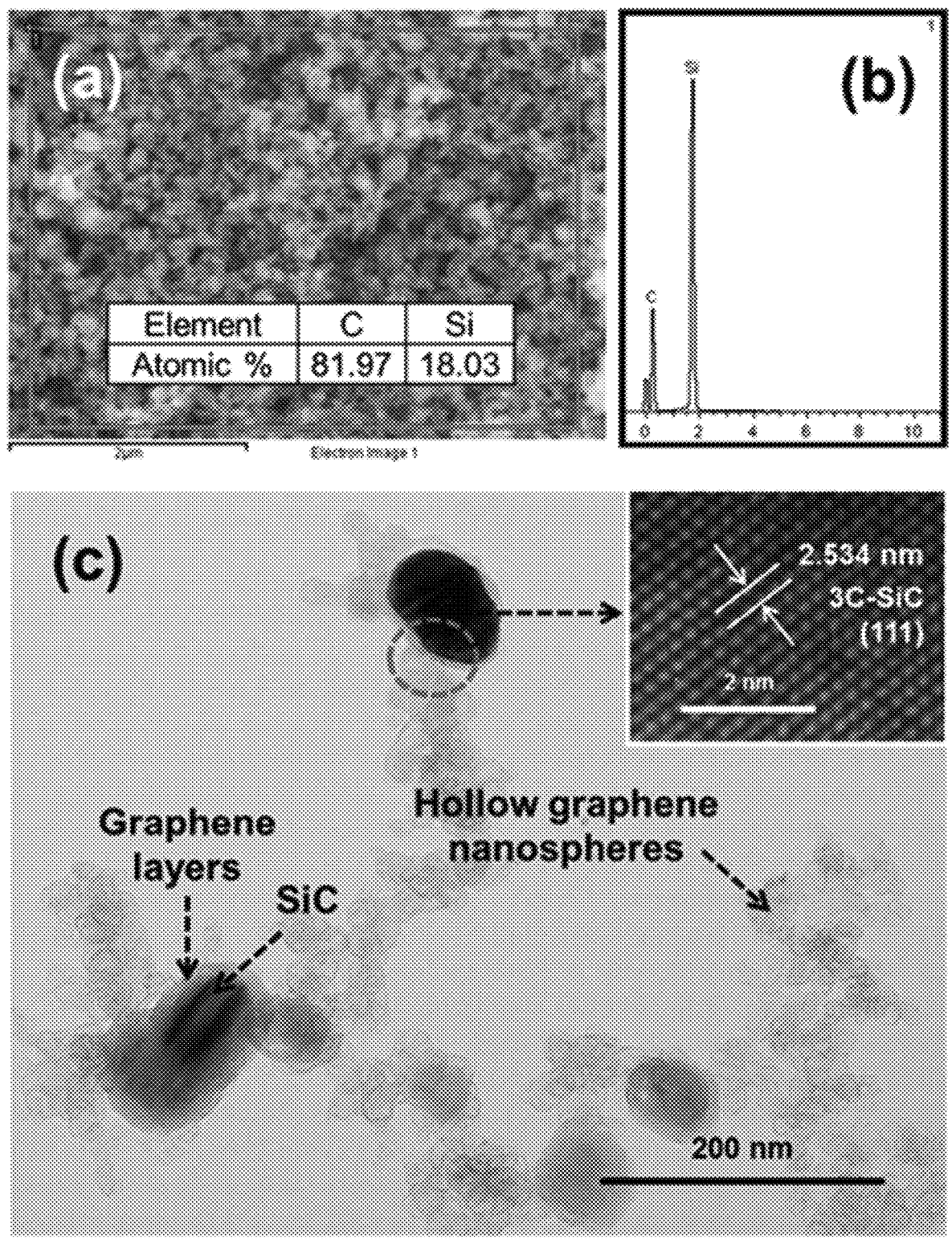
FIG. 5 shows (a) a SEM image, (b) an EDS spectrum and (c) a TEM image of the graphene nanospheres manufactured in Example 3 of the present invention.

FIG. 5 shows (a) a SEM image, (b) an EDS spectrum and (c) a TEM image of the graphene nanospheres manufactured in Example 3 of the present invention. With reference to FIG. 5, in the graphene nanospheres produced at a temperature of 1900° C., the number of hollow graphene nanospheres was significantly increased, unlike the graphene nanospheres of Example 2 manufactured at 1500° C. As shown in FIG. 5, the inner diameter of the hollow graphene nanospheres was 20 to 30 nm.

In Example 3, 80% of the reaction product was hollow graphene nanospheres, and the remaining 20% was graphene nanospheres, the insides of which were filled.

The technical spirit of the present invention described above is not limited to the aforementioned embodiments and the appended drawings, and those skilled in the art will appreciate that various modifications, additions and substitutions are possible, without departing from the scope and spirit of the invention as disclosed in the accompanying claims.

The invention claimed is:

1. A method of manufacturing a graphene nanosphere, comprising:
    step 1 of manufacturing a silicon carbide nanosphere coated with graphene through chemical vapor deposition (CVD) using a gas containing a silicon source and a carbon source, and
    step 2 of discontinuing the chemical vapor deposition (CVD) and then performing cooling to form the graphene nanosphere.

2. The method of claim 1, wherein the silicon source and the carbon source are a single gas containing silicon and carbon.

3. The method of claim 1, wherein the step 1 is performed at a temperature of 1000 to 3000° C. under a pressure of 100 to 760 torr.

4. The method of claim 3, wherein the step 1 is performed at a temperature of 1000 to less than 2000° C.

5. The method of claim 4, wherein the graphene nanosphere comprises a silicon carbide nanocrystal core and a graphene coating layer formed on the core.

6. The method of claim 1, wherein the step 1 is performed at a temperature of 2000 to 3000° C.

7. The method of claim 6, wherein the graphene nanosphere is a hollow graphene nanosphere.

8. The method of claim 1, wherein the step 1 comprises supplying a gas containing a carrier gas.

9. The method of claim 8, wherein in the step 1, a flow rate ratio of (carrier gas)/(silicon source and carbon source) is 10 to 1000.

* * * * *